United States Patent [19]

Olsson

[11] 4,181,386

[45] Jan. 1, 1980

[54] ZERO INSERTION FORCE CONNECTOR CLIP

[75] Inventor: Billy E. Olsson, New Cumberland, Pa.

[73] Assignee: AMP Incorporated, Harrisburg, Pa.

[21] Appl. No.: 953,677

[22] Filed: Oct. 23, 1978

Related U.S. Application Data

[63] Continuation-in-part of Ser. No. 918,139, Jun. 22, 1978.

[51] Int. Cl.² .......................... H05K 1/12; H05K 3/36
[52] U.S. Cl. .................................. 359/17 F; 29/758; 339/74 R; 339/176 MF
[58] Field of Search .............. 339/17 F, 74 R, 75 MP, 339/176 MF; 29/758, 764

[56] References Cited

U.S. PATENT DOCUMENTS

| 3,629,787 | 12/1971 | Wilson | 339/17 F |
| 3,828,300 | 8/1974 | Codrino | 339/74 R |

FOREIGN PATENT DOCUMENTS

2241888  3/1975  France .............................. 339/176 MF

*Primary Examiner*—Neil Abrams
*Attorney, Agent, or Firm*—Frederick W. Raring

[57] ABSTRACT

Zero insertion and extraction force connector clip for connecting conductors on a thin film to conductors on a circuit board comprises a one-piece stamped and formed member having a rectangular clip bar and means at each of its ends for mounting the clip on a circuit board in straddling relationship to the circuit board conductors. A plurality of contact springs extend from one edge of the clip bar. Each spring is reversely bent at the one edge and has a spring arm portion extending obliquely underneath the clip bar so that when the clip is mounted on the circuit board, contact portions of the springs will be against the circuit board conductors. The ends of the springs have toolengageable portions which can be engaged by a uniquely suited tool. The tool functions to raise the springs from the circuit board so that the film can be inserted between, and extracted from, the circuit board and the springs with zero force on the film conductors.

6 Claims, 8 Drawing Figures

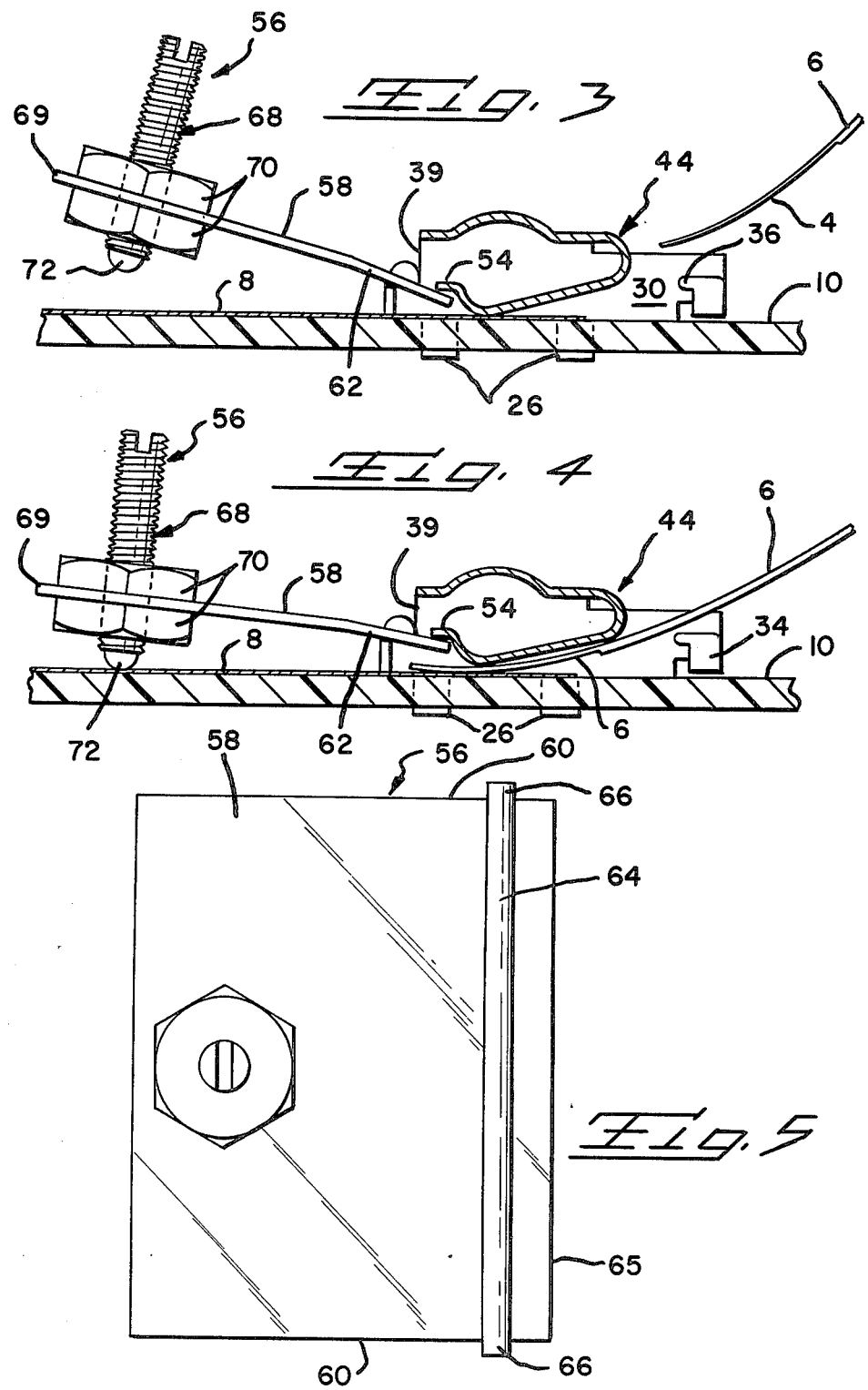

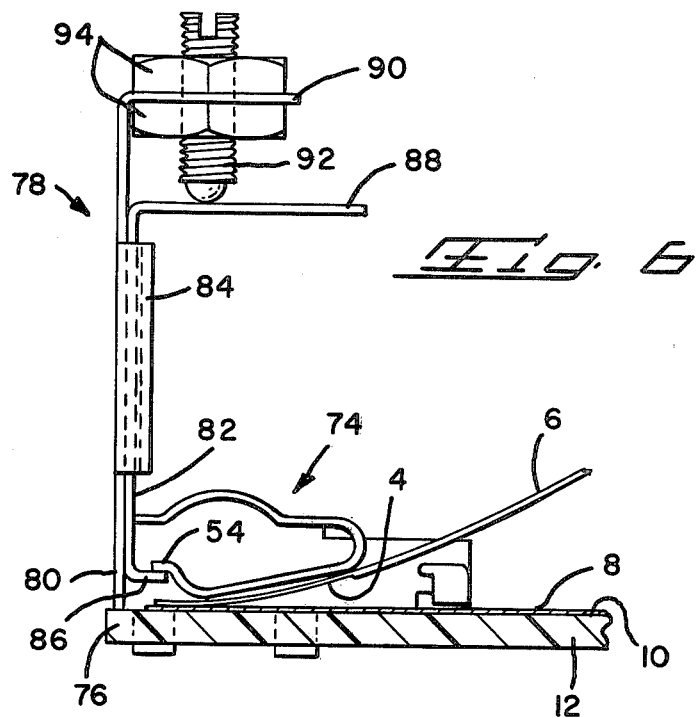
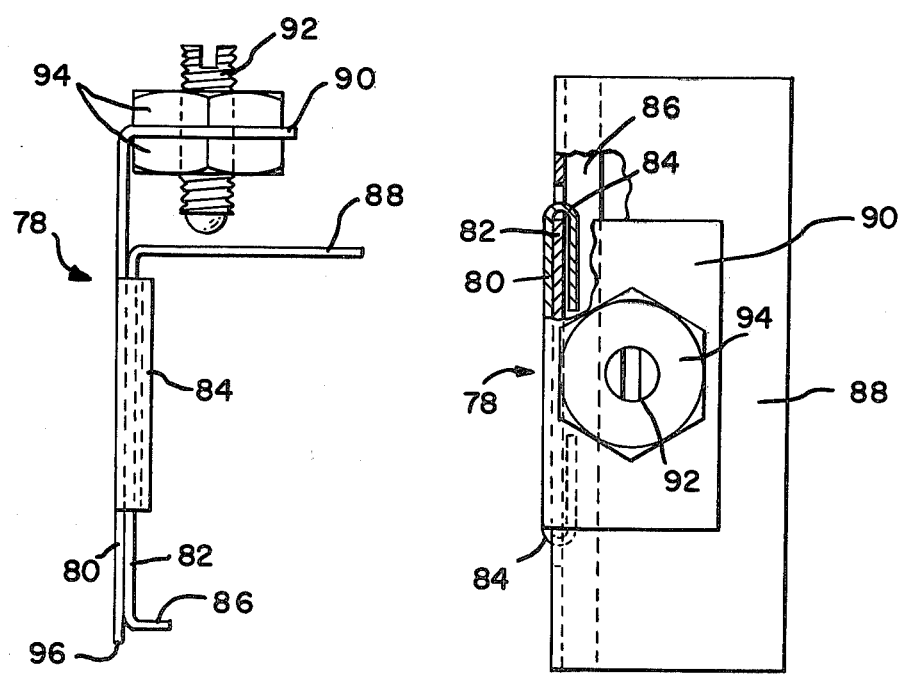

ZERO INSERTION FORCE CONNECTOR CLIP

This application is a continuation-in-part of U.S. Application Ser. No. 918,139 filed June 22, 1978 pending.

DESCRIPTION

1. Field of the Invention:

This invention relates to one-piece connector clips of the type which are used for connecting conductors on a thin film to conductors on a circuit board.

The invention specifically relates to zero insertion force connector clip systems which permit the use of connector clips with extremely thin films having fragile conductors on their surfaces such as printed or silk-screened conductors.

2. Background of the Invention:

Application Ser. No. 918,139 discloses and claims a one-piece stamped and formed connector clip which is adapted to be mounted on a circuit board in straddling relationship to a plurality of parallel side-by-side conductors on the circuit board. The clip serves to connect conductors on a thin film to the circuit board and it has a plurality of cantilever springs extending from one of its edges which bear resiliently against the circuit board conductors when the clip is mounted on the circuit board. The clip does not carry an electrical current but merely clamps the film conductors against the circuit board conductors.

The conductors on the film are disengageably connected to the circuit board conductors by simply inserting a portion of the film between the spring members of the clip and the surface of the board so that the springs serve to clamp the film conductors against the circuit board conductors.

Connector clips as described in the above identified application are being enthusiastically received in the electrical and electronics industry. Connector clips, as described in that application, can be used successfully and to advantage when the film is comparatively strong and firm and the conductors are durable and resistant to damage from abrasion. Thus, clips as described in the above application can be used where the film is of relatively heavy Mylar (polyester film) and the conductors are of wrought copper conductors bonded to the film.

Difficulties are encountered when it is attempted to use a connector clip with extremely thin films having fragile conductors on their surface. The thin films tend to buckle when an attempt is made to insert them between the springs of the connector clip and the surface of the circuit board against which the springs are biased. The fragile conductors such as printed conductors and silkscreened conductors, which are widely used on extremely thin films are, furthermore, damaged during insertion of the film for the reason that they cannot withstand the abrasive effects of the springs as they are inserted between the connector clip and the surface of the circuit board.

The instant invention is directed to the achievement of a connector clip in accordance with the teachings of application Ser. No. 918,139, which possesses a zero insertion force characteristic; that is, an arrangement whereby the film can be inserted when the contact springs are spaced from the conductors on the surface of the circuit board so that no compressive forces are imposed on the film or on the conductors during insertion.

To achieve this zero insertion force characteristic, the free ends of the contact springs have tool-engageable portions and the connector clip is constructed for cooperation with a tool which is uniquely suited to engage the free ends of the springs and raise them from the surface of the circuit board during insertion of the film. The tool and the connector clip have features which insure that all of the springs of the clip will be engaged by the tool and that the springs will not be destroyed by overstressing when they are raised from the circuit board by the tool.

NEW DRAWING:

FIGS. 3 and 4 are views similar to FIG. 2 illustrating the use of one type of zero insertion force tool.

FIG. 5 is a top plan view of the tool shown in FIGS. 3 and 4.

FIG. 6 is a view similar to FIG. 3 showing an alternative connector clip and tool.

Figure 1:
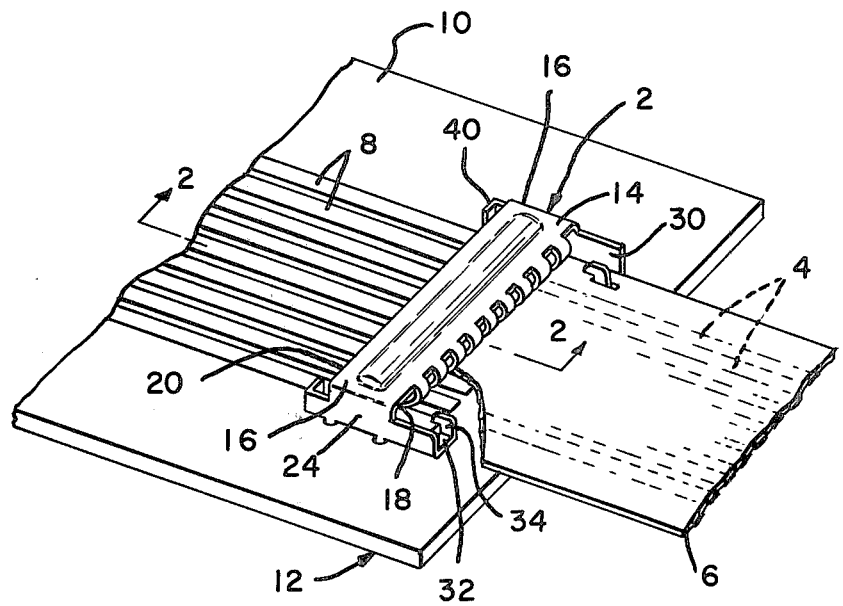
FIG. 1 is a perspective view of a connector clip in accordance with the invention mounted on a circuit board and showing a film inserted into the clip so that film conductors are electrically connected to the circuit board conductors.

FIGS. 7 and 8 present side and top plan views of the tool shown in FIG. 6.

REMARKS

A connector clip 2 in accordance with the invention serves to connect conductors 4 on the underside of a thin film 6 to a like number of spaced-apart parallel conductors 8 on the upper surface 10 of a circuit board 12. The connector clip 2 is a one-piece stamped and formed member and is of a suitable spring material such as a stainless steel. The clip need not have good electrical conducting characteristics.

Figure 2:
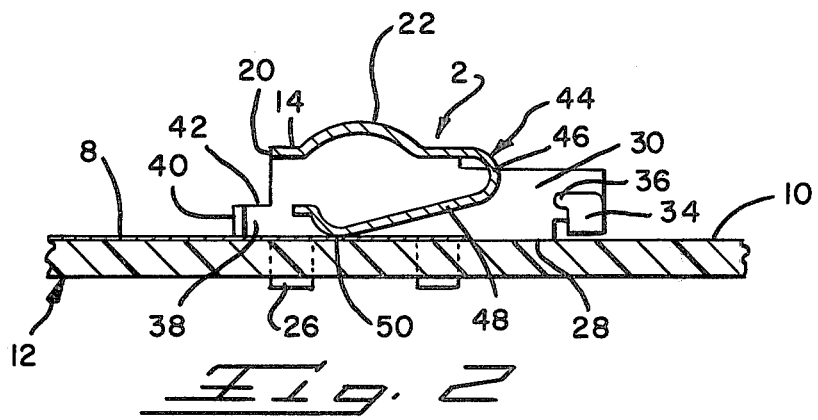
FIG. 2 is a cross-sectional view taken along the line 2—2 of FIG. 1 but with the film removed.

The clip 2 comprises a rectangular clip bar 14 having ends 16 and first and second side edges 18, 20 extending between the ends. The clip bar 14 may be embossed as shown at 22 to render it resistant to flexure under the influence of the contact springs 44 described below. The clip has mounting means for mounting it on the surface 10 in the form of flanges 24 which extend from the ends 16 and which have mounting ears 26 extending from their lower edges 28 as shown in FIG. 2. These ears are intended to be inserted through openings in the circuit board 12 and clinched as shown.

Each flange has an extension 30 which projects laterally beyond the first edge 18 and which has an inwardly directed arm 32 on its end. The arms 32 have upwardly extending ears 34 thereon which have extensions 36 extending towards the first edge 18 as shown in FIG. 2. The ears 34 are dimensioned to be received in punched holes in the film 6 so that a strain relief is provided for the film.

A relatively short extension 38 of each flange 24 projects past the second edge 20 adjacent to the lower edge 28 of each flange. These extensions 38 have inwardly directed stop ears 40 on their ends which serve as stops for the film 6 during insertion. The upper edges 42 of the extensions 38 and the ears 40 cooperate with a zero insertion force tool as will be described below to provide a fulcrum for the tool.

A plurality of cantilever springs 44 extend from the first edge 18 of the clip bar 14 and are reversely bent at 46 adjacent to this first edge. Each spring has a spring arm portion 48 extending obliquely from its bend 46 and an arcuate contact portion 50 which bears against a conductor 8 when the clip is mounted on the circuit board 12. A portion 52 extends upwardly as viewed in FIG. 2 from the contact portion 50 and merges with a tool engageable free end portion 54 which extends substantially parallel to the surface 10 of the circuit board and which is between the opposed surfaces of the flanges 24.

When the film 6 is to be inserted between the contact portions 50 of the springs and the surface 10 of the circuit board, a tool 56, FIGS. 3-5, is used. This tool comprises a rectangular plate 58 having parallel side edges 60 which are spaced apart by a distance which is slightly less than the spacing between the opposed surfaces of the flanges 24. The right hand portion 62 of the plate 58, as viewed in FIG. 4, extends obliquely downward from the central portion of the plate and a half-round positioning bar 64 is fixed on this portion 62. The positioning bar 64 extends parallel to the right hand edge 65 of the plate and its ends extend beyond the side edges 60 as shown at 66.

A stop is provided on the plate in the form of a set screw 68 which extends through an opening in the plate adjacent to the left hand end 69 and which is held in its adjusted position by lock nuts 70. The lower end 72 of the set screw 68 is spherical to prevent damage to the conductors on the board 12.

In use, and when it is desired to insert the film 6 between the clip springs 44 and the surface 10 of the board 12, the tool 56 is positioned as shown in FIG. 3 with the end portion 62 of the plate 58 extending between the flanges 24 and beneath the tool engageable free end portions 54 of the springs 44. The upper edges 42 of the extensions 38 of the flanges serve as fulcrums for the tool and vertical edges 39 of the flanges serve as stops for the ends 66 of the stop bar 64. After the tool has been positioned as shown in FIG. 3, it is merely necessary to swing the plate 58 downwardly until the lower end 72 of the set screw is against the surface 10 of the circuit board thereby to raise the springs 44 as shown in FIG. 4. The film 6 can then be inserted as also illustrated in FIG. 4 and the tool removed so that the springs return to their normal position and press the conductors 4 against the conductors 8 on the surface 10 of the circuit board. The tool is used in the same manner when the film is extracted from between the clip and the surface of the circuit board. The set screw 56 should be adjusted such that the spring arms 48 will be raised a very slight distance in FIG. 4 (no more than the thickness of the film), thereby to prevent damage to the individual springs by overstressing.

FIG. 6 shows a clip 74 which is intended to be mounted on the circuit board 12 immediately adjacent to one edge 76 of the circuit board. The connector clip 74 is similar to the clip 2 excepting that it does not have an extension 38 on its left hand side as viewed in FIG. 6.

The tool 78 which is uniquely intended for use with the clip 74 comprises a flat generally rectangular frame plate 80 and a flat slide member or slide plate 82 which is held against the frame plate by reversely formed integral holding members 84 on the frame plate. The lower end of the slide plate 82 has a laterally extending spring engaging foot portion 86, the width of which is substantially equal to the distance between the opposed surfaces of the flanges 24. A rightwardly extending finger grip portion 88 is provided on the upper end of the slide plate to permit it to be pulled upwardly relative to the frame plate from the position of FIG. 7. The adjustable stop of this embodiment comprises a screw 92 which extends through a flange 90 on the upper end of the frame plate 80 and which is held in its position of adjustment by lock nuts 94.

In use, the tool 78 is located on the upper surface 10 of the circuit board 12 as shown in FIG. 6, with the lower edge 96 of of the frame plate against the circuit board. The spring engaging foot 86 will then extend beneath the free ends 54 of the springs and the slide member 82 can be pulled upwardly to raise the springs and permit zero force insertion of the film as previously described. The lower end of the frame plate 80 functions as a stop when the cable is inserted.

Zero insertion force connector clip systems in accordance with the invention can be used as a matter of convenience when the film is relatively heavy and the conductors are wrought conductors which will withstand abrasion and compressive force during insertion. The use of the present system will facilitate the insertion operation and permit the technician to concentrate on proper location of the cable in the clip. The use of the present zero insertion force system is, however, highly desirable if not necessary, when the film is relatively thin and flimsy and the conductors 4 on the film 6 are extremely fragile and subject to damage. It will thus be apparent that a zero insertion force connector clip system in accordance with the invention can be used under all circumstances where conductors on a film are to be connected to parallel spacedapart conductors on a circuit board.

The connector clip is not electrically involved in the electrical connections of the conductors 4 to the conductors 8 since the conductors 4 are on the underside of the film 6 and the clip does not contact the conductors 8 on the circuit board. It is, therefore, unnecessary that the clip be insulated, however, a thin film of insulation can be provided on the clip if desired, for example, a polyvinyl formal resin film of the type used for coil windings.

I claim:

1. A zero insertion force electrical connector clip for connecting parallel spacedapart film conductors on a film to parallel spaced-apart circuit board conductors on a circuit board, said clip comprising:

a one-piece stamped and formed member having a rectangular clip bar, said clip bar having ends, having first and second side edges extending between said ends and having integral mounting and supporting means extending from said ends for mounting said clip on a circuit board with said clip bar spaced from, and parallel to said circuit board and extending transversely of said circuit board conductors, said mounting and supporting means comprising flanges extending from said ends of said clip bar, the distance between the opposed surfaces of said flanges being equal to the width of said film, a plurality of spaced-apart cantilever springs extending from said first side edge, the number of said springs being equal to the number of said film conductors, said cantilever springs being reversely bent adjacent to said first side edge and having spring arm portions between said flanges, said cantilever springs each having a free end portion which is remote from said first side edge, said free end portions extending substantially parallel to said clip bar whereby, upon mounting said clip on said circuit board in straddling relationship to said circuit board conductors on said circuit board and with said spring arm portions of said cantilever springs resiliently biased against said circuit board conductors, said cantilever springs can be raised from said circuit board by said free end portions thereby to permit insertion of said film between said cantilever springs and said circuit board with zero insertion force.

2. An electrical connector clip as set forth in claim 1, said flanges extending laterally beyond said second side edges and having ends which are spaced from said second side edge, said ends having inwardly directed ears thereon extending towards each other, said ears serving as fulcrums for a tool for raising said cantilever springs during insertion and extraction of said film.

3. A zero insertion force connector clip system for connecting parallel spaced-apart film conductors on a film to parallel spaced-apart circuit board conductors on a circuit board, said system comprising a connector clip and a clip tool which is uniquely usable with said clip:

said clip comprising a one-piece stamped and formed member having a rectangular clip bar, said clip bar having ends, having first and second side edges extending between said ends and having integral mounting and supporting means extending from said ends for mounting said clip on a circuit board with said clip bar spaced from, and parallel to, said circuit board and extending transversely of said circuit board conductors, cantilever spring means extending from said first side edge, said cantilever spring means being reversely bent adjacent to said first side edge and having a spring arm portion between said mounting and supporting means, said cantilever spring means having a tool engageable free end portion which is remote from said first side edge, said tool comprising movable spring engaging means for engagement with said free end portion of said cantilever spring means, positioning means for positioning said tool proximate to said clip when said clip is mounted on said circuit board with said spring engaging means in engagement with said free end portion, and stop means, said stop means being effective to limit movement of said spring engaging means during use of said tool to prevent overstressing of said cantilever spring means whereby, upon mounting said clip on said circuit board in straddling relationship to said circuit board conductors and with said spring arm portion of said cantilever spring means resiliently biased against said circuit board conductors, said cantilever spring means can be raised from said circuit board by said clip tool thereby to permit insertion of said film between said cantilever spring means and said circuit board with zero insertion force.

4. A system as set forth in claim 3, said tool comprising a lever, said spring engaging means comprising one end of said lever, said positioning means comprising positioning stop means on said lever intermediate the ends thereof, said positioning stop means being movable against portions of said clip when said one end is inserted between said clip and said circuit board past said second side edge, said stop means comprising a stop extending laterally of said lever at the other end thereof and being engageable with said circuit board when said free end portion of said cantilever spring means is raised from said circuit board by said one end of said lever, said clip having integral fulcrum means proximate to said ends and proximate to said second side edge for cooperation with said lever.

5. A system as set forth in claim 4, said mounting and supporting means comprising flanges extending from said ends of said clip bar, said flanges extending laterally of said clip bar beyond said second side edge, said fulcrum means being on said flanges.

6. A system as set forth in claim 3, said tool comprising a frame member and a slide member, said members being in parallel juxtaposed relationship, said positioning means comprising one end of said frame member which is positionable against said circuit board with said members extending normally of said circuit board, said slide member being slidaby movable on said frame member and parallel thereto, said spring engaging means extending laterally of said slide member adjacent to said one end of said frame member, said stop means being on the other end of said frame member and being engageable by said slide member when said slide member is moved towards said other end whereby upon positioning said one end of said frame member against said circuit board with said spring engaging means in engagement with said free end portion of said cantilever spring means, and upon moving said slide member against said stop means, said cantilever spring means is flexed and moved away from said circuit board.

* * * * *